(12) United States Patent
Ghyselen et al.

(10) Patent No.: US 6,974,760 B2
(45) Date of Patent: Dec. 13, 2005

(54) METHODS FOR TRANSFERRING A USEFUL LAYER OF SILICON CARBIDE TO A RECEIVING SUBSTRATE

(75) Inventors: Bruno Ghyselen, Seyssinet-Pariset (FR); Fabrice Letertre, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/893,192

(22) Filed: Jul. 15, 2004

(65) Prior Publication Data

US 2005/0032330 A1 Feb. 10, 2005

Related U.S. Application Data

(63) Continuation of application No. PCT/EP03/00692, filed on Jan. 21, 2003.

(30) Foreign Application Priority Data

Jan. 23, 2002 (FR) ............................................. 02 00813

(51) Int. Cl.$^7$ ................................................ H01L 21/30
(52) U.S. Cl. ........................ 438/459; 438/464; 438/463
(58) Field of Search .......................... 438/528, 455–465, 438/977, 106–17

(56) References Cited

U.S. PATENT DOCUMENTS

| | | | | |
|---|---|---|---|---|
| 6,020,252 A | * | 2/2000 | Aspar et al. | 438/458 |
| 6,150,239 A | | 11/2000 | Goesele et al. | 438/458 |
| 6,323,109 B1 | * | 11/2001 | Okonogi | 438/459 |
| 6,355,541 B1 | | 3/2002 | Holland et al. | 438/459 |
| 6,391,799 B1 | * | 5/2002 | Di Cioccio | 438/781 |
| 6,562,127 B1 | * | 5/2003 | Kud et al. | 117/94 |
| 2002/0094668 A1 | * | 7/2002 | Asper et al. | 438/526 |
| 2003/0040136 A1 | * | 2/2003 | Eriksen et al. | 438/50 |
| 2004/0014299 A1 | * | 1/2004 | Moriceau et al. | 438/459 |
| 2004/0224482 A1 | * | 11/2004 | Kub et al. | 438/458 |

OTHER PUBLICATIONS

Di Cioccio L .et al., 1996, "Silicon carbide on insulator formation using the Smart Cut process", Electronics Letters, IEE Stevenage, GB, vol. 32, No. 12, pp. 1144–1145.
Bennett J. A. et al., 2000, "Complete Exfoliation of 4H–SIC By H+– and SI+– Coimplantation", Applied Physics Letters, American Institute of Physics, vol. 76, No. 22, pp. 3265–3267.
Gregory R. B. et al., 1999, "The Effects of Damage on Hydrogen–Implant–Induced Thin–Film Separation from Bulk Silicon Carbide", Materials Research Society Symposium Proceedings, Materials Research Society, vol. 572, pp. 33–38.
Tong Q.Y. et al., 1998, "Si and SiC layer transfer by high temperature hydrogen implantation and lower temperature layer splitting", Electonics Letters, IEE Stevenage, GB, vol. 34, No. 4, pp. 408–408.
Di Cioccio et al., "Silicon carbide on insulator formation by the Smart–Cut® process," Materials Science and Engineering B46, pp. 349–356 (1997).

* cited by examiner

*Primary Examiner*—Savitri Mulpuri
(74) *Attorney, Agent, or Firm*—Winston & Strawn LLP

(57) ABSTRACT

Methods for transferring a useful layer of silicon carbide to a receiving substrate are described. In an embodiment, the technique includes implanting at least $H^+$ ions through a front face of a source substrate of silicon carbide with an implantation energy E greater than or equal to 95 keV and an implantation dose D chosen to form an optimal weakened zone near a mean implantation depth, the optimal weakened zone defining the useful layer and a remainder portion of the source substrate. The method also includes bonding the front face of the source substrate to a contact face of the receiving substrate, and detaching the useful layer from the remainder portion of the source substrate along the weakened zone while minimizing or avoiding forming an excess zone of silicon carbide material at the periphery of the useful layer that was not transferred to the receiving substrate during detachment. Such a method facilitates recycling the remainder portion of the source substrate.

20 Claims, 5 Drawing Sheets

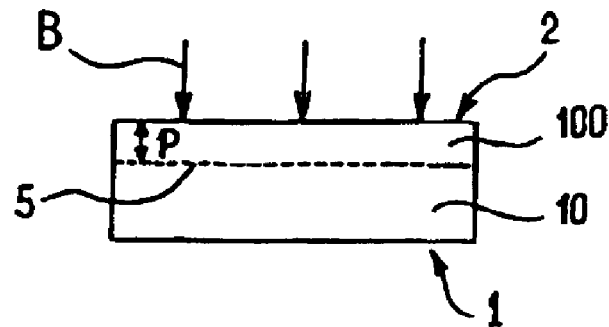
FIG._6
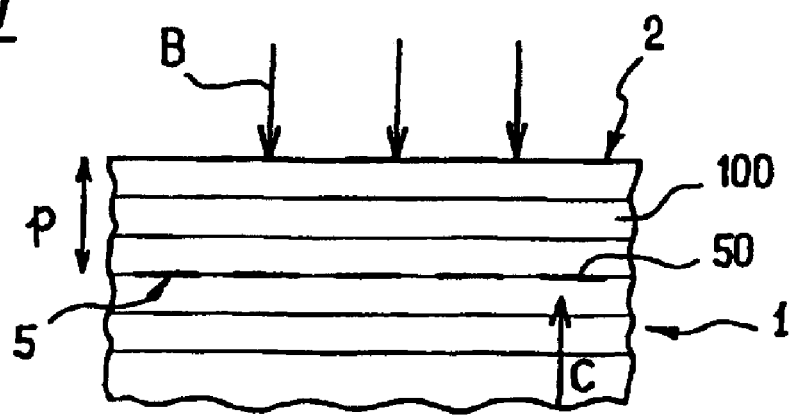
FIG._7
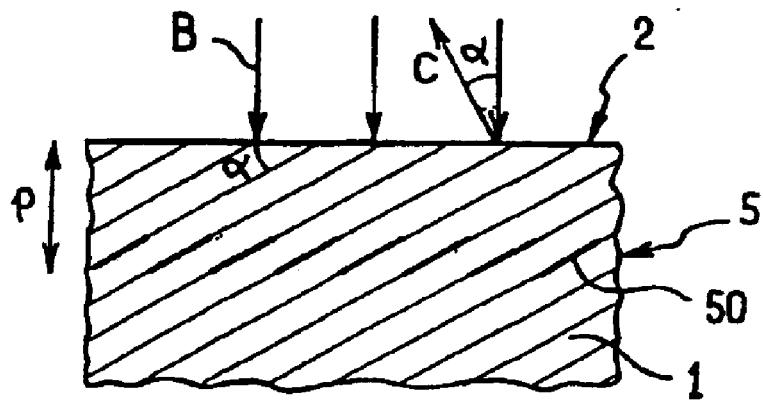
FIG._8

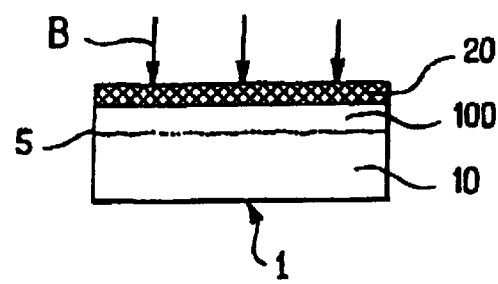
FIG_9
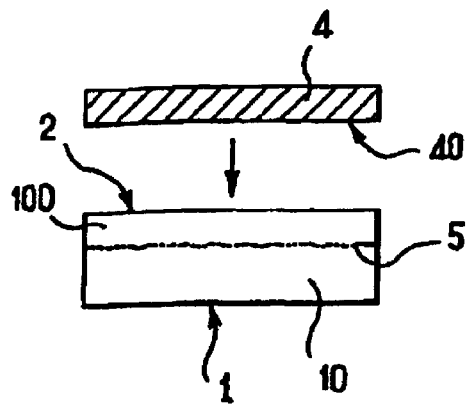
FIG_10
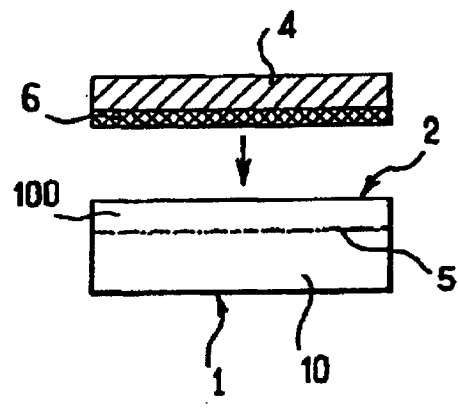
FIG_11
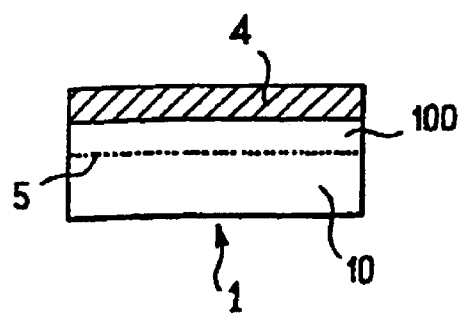
FIG_12
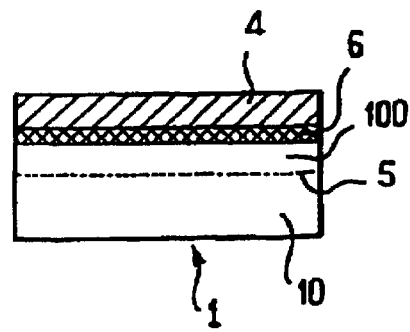
FIG_13

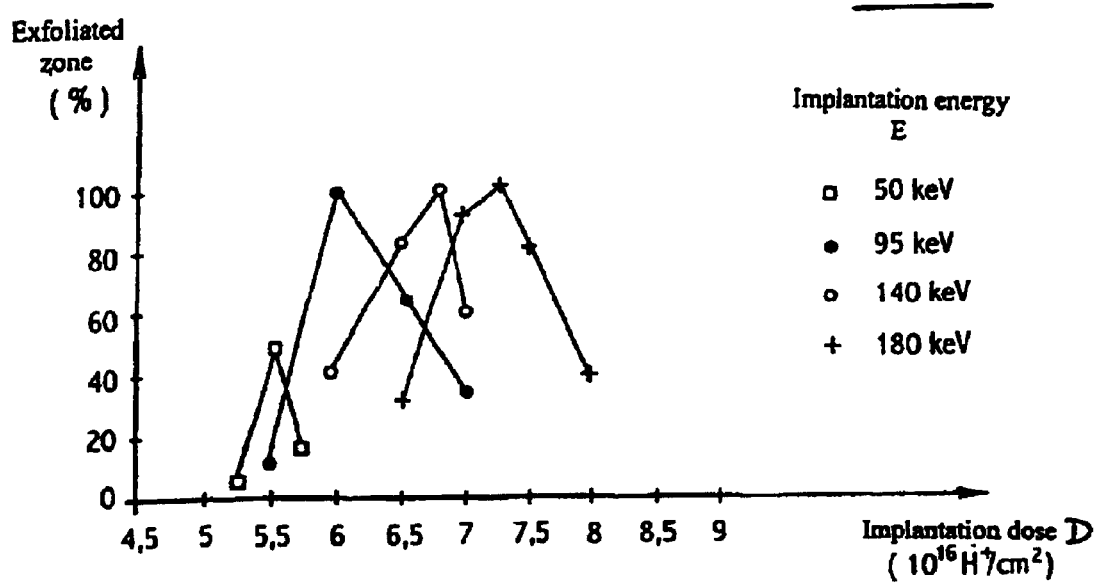
FIG_19
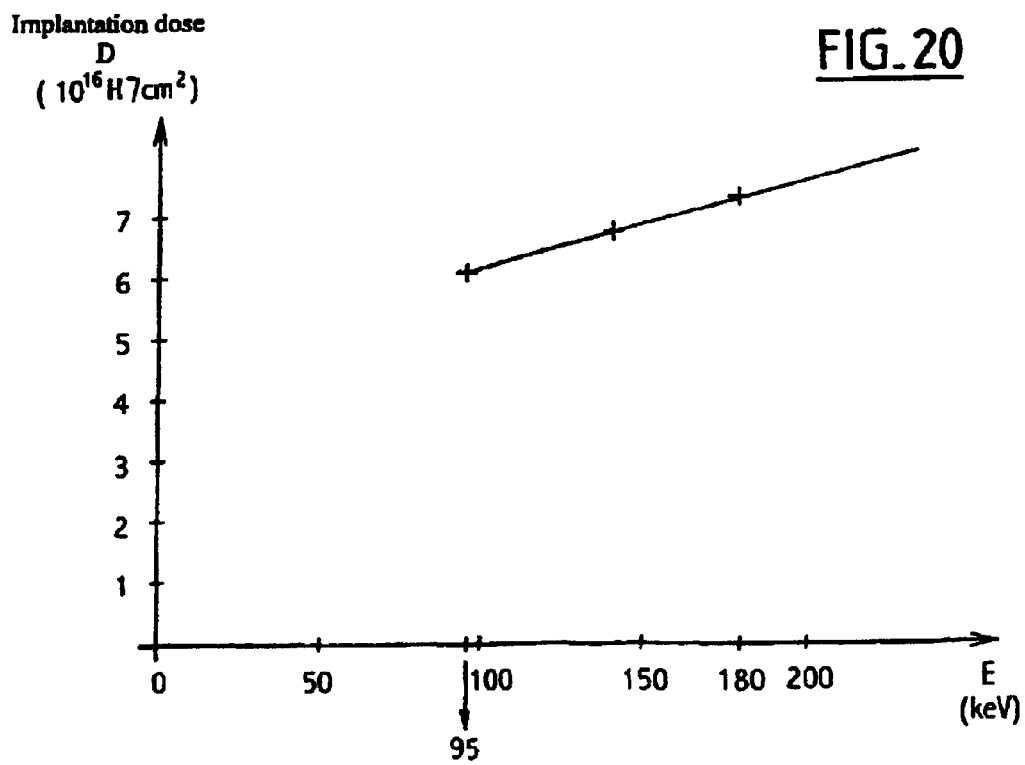
FIG_20

METHODS FOR TRANSFERRING A USEFUL LAYER OF SILICON CARBIDE TO A RECEIVING SUBSTRATE

CROSS-REFERENCE TO RELATED APPLICATIONS

This application is a continuation of International application no. PCT/EP03/00692 filed Jan. 21, 2003, the entire content of which is expressly incorporated herein by reference thereto.

BACKGROUND ART

The present invention relates to an optimized method for transferring an useful layer of monocrystalline silicon carbide (SiC) derived from a source substrate of the same material to a receiving or stiffening substrate. The method permits recycling of the substrate after the transfer of the thin useful layer.

The method known under the trademark "SMART-CUT®" enables a thin layer to be transferred from a source substrate to a receiving substrate such as, for example, an oxidized silicon or polycrystalline silicon carbide substrate. This method also enables the source substrate from which the thin layer has been taken to be reused. However, after each layer transfer step, the upper surface of the source substrate has a certain number of surface irregularities. The formation of these surface irregularities will be described with reference to FIGS. 1–5, which show a specific example of implementation of the "SMART-CUT®" method. This method is known to those skilled in the art and will not be described in detail.

FIG. 1 shows a source substrate 1 which has a planar face 2, or a "front face", through which gas species have been implanted. This implantation is carried out by ion bombardment, for example with $H^+$ ions (reference B in FIG. 1) using an implanter. The implantation is performed at a specific energy, implantation dose, and temperature, and creates a weakened zone 3 in the neighborhood of the mean implantation depth p of the ions. This weakened zone 3 delimits two portions in the source substrate 1: an upper thin layer or useful layer 100 extending between the front face 2 and the weakened zone 3, and the remainder 10 of the substrate. As. shown in FIG. 2, a stiffener or receiving substrate 4 is then applied to the front face 2 of the source substrate 1. This stiffener is chosen by a person skilled in the art as a function of the final application envisaged. The receiving substrate 4 may be applied in a known manner, for example, by evaporation, spraying, chemical vapor deposition, or it can be bonded to the front face by using an adhesive or by a technique known as "bonding by molecular adhesion", also known as "wafer bonding".

As shown in FIG. 3, the thin layer 100 is detached from the remainder 10 of the substrate 1. This detachment step, which is symbolized by the arrows S, may be performed by applying either mechanical stresses to the stiffener 4, or by the applying thermal energy to the assembly that includes the stiffener 4 and the substrate 1.

Wafers chosen for use as a source substrate 1 possess reduced edges due to chamfering operations performed, for example, during their manufacture. As a result, the adhesion forces between the stiffener 4 and the front face 2 are weaker in a substantially annular periphery of the source substrate 1. Consequently, when the stiffener 4 is detached from the source substrate 1, only the central portion of the thin layer 100, which is strongly adhering to the stiffener 4, is detached, while the substantially annular periphery of the useful layer 100 remains attached to the remainder 10 of the source substrate 1 as shown in FIG. 3. As a result, the source substrate 1 thus simultaneously includes a surface roughness 11 in its central portion due to detachment in the region of the weakened zone 3, and at its periphery has an excess thickness 12 or surface topology in the form of a blistered zone corresponding to the zones that were not transferred to the receiving substrate or stiffener 4. The depth of this excess zone 12 is equal to the thickness of the transferred thin layer 100. It typically varies from several tens of nanometers to more than a micrometer. The depth is determined by the implantation energy of the hydrogen ions.

In FIGS. 3 and 4, the excess zone 12 has intentionally been shown, for the sake of clarity and simplification, having a rectangular cross section and having a noticeable thickness with respect to the remainder 10 of the source substrate. In reality, it has a much more irregular shape and a proportionally smaller thickness.

Before proceeding to transfer another thin layer, it is imperative to recycle the remainder 10 of the source substrate. This recycling consists of a planarization step, depicted by the arrows P in FIG. 4, wherein the excess zone 12 is eliminated, and a specific finishing step depicted by the arrow F in FIG. 5, that permits elimination of the surface roughness 11 to attain a substrate having a new front face 2'. These recycling steps are generally performed by mechanical and/or mechanical-chemical polishing techniques. In the specific case where the source substrate 1 is made of silicon carbide, an extremely hard material, such polishing steps are extremely long and costly.

The prior art document, "The effects of damage on hydrogen-implant-induced thin-film separation from bulk silicon carbide", *R. B. Gregory, Material Research Society Symposium*, Vol. 572, 1999, discloses that the choice of hydrogen implantation conditions for implanting into silicon carbide permits varying the percentage of removal of the excess zone, that is, the percentage of the free surface of silicon carbide which is spontaneously eliminated during thermal annealing of the substrate. In this article, the results show the $H^+$ ion implantation dose as a function of the percentage of the excess zone removed is a bell-shaped curve at an implantation energy of 60 keV, with a maximum value of 33% of the zone removed, for an implantation dose of $5.5\times10^{16} H^+/cm^2$. When departing from this value, that is if the implantation dose is increased or decreased, then the removal percentage decreases.

The document "Complete surface exfoliation of 4H—SiC by $H^+$ and Si+ co-implantation", J. A. Bennett, Applied Physics Letters, Vol. 76, No. 22, pages 3265–3267, May 29, 2000, describes that it is possible to perform a complete exfoliation of the surface of a silicon carbide substrate by co-implanting $H^+$ and $Si^+$ ions. More specifically, this document describes tests performed on 4H—SiC silicon carbide by implanting $Si^+$ ions at various doses and at an energy of 190 keV, then implanting $H^+$ ions at an implantation dose of $6\times10^{16}$ $H^+/cm^2$ and at an energy of 60 keV. Implantation doses of Si+ greater than or equal to $5\times10^5$ $Si^+/cm^2$ permitted exfoliation of 100% of the silicon carbide surface. However, the Si ion implantation dose necessary for total exfoliation of the SiC layer is also high enough to render the silicon carbide amorphous. This method is therefore incompatible with transferring a thin film of silicon carbide of good crystalline quality, since it is not possible to utilize a thin film from such a substrate for forming devices used in microelectronics or opto-electronics.

SUMMARY OF THE INVENTION

Presented are methods for transferring a useful layer of silicon carbide to a receiving substrate. In an embodiment, the technique includes implanting at least $H^+$ ions through a front face of a source substrate of silicon carbide with an implantation energy E greater than or equal to 95 keV and an implantation dose D chosen to form an optimal weakened zone near a mean implantation depth, the optimal weakened zone defining the useful layer and a remainder portion of the source substrate. The method also includes bonding the front face of the source substrate to a contact face of the receiving substrate, and detaching the useful layer from the remainder portion of the source substrate along the weakened zone while minimizing or avoiding forming an excess zone of silicon carbide material at the periphery of the useful layer that was not transferred to the receiving substrate during detachment. Such a method facilitates recycling the remainder portion of the source substrate.

In a preferred embodiment, the implantation dose D of $H^+$ ions, expressed as a number of $H^+$ ions/cm$^2$, satisfies the equation: $[(E \times 1 \times 10^{14} + 5 \times 10^{16})/1.1] \leq D \leq [(E \times 1 \times 10^{14} + 5 \times 10^{16})/(0.9)]$. Advantageously, the implanted ions include $H^+$ ions, or a combination of $H^+$ ions and helium or boron ions. The method beneficially includes implanting $H^+$ ions while maintaining the source substrate at a temperature no greater than 200° C. Ions may be implanted in a random fashion. The source substrate may be a disoriented monocrystalline silicon carbide.

An advantageous implementation further includes detaching the useful layer along the optimal weakened zone by applying a thermal budget or external mechanical stresses and in a manner so that no excess zone remains. In a beneficial implementation, the useful layer is detached by applying a thermal budget that is greater than about 700° C.

Another advantageous embodiment includes providing a layer of amorphous material on the source substrate before implanting ions, wherein the thickness of the amorphous material is less than or equal to about 50 nanometers. The amorphous material may be formed of a material chosen from among silicon oxide ($SiO_2$) or silicon nitride ($Si_3N_4$). In a variant, the bonding step includes molecularly adhering the receiving substrate to the front face of the source substrate. An intermediate bonding layer may be provided on at least one of the front face and the contact face, and the intermediate bonding layer could include an amorphous material such as silicon oxide ($SiO_2$) or silicon nitride ($Si_3N_4$).

In a preferred embodiment, the receiving substrate comprises at least one of silicon, silicon carbide, gallium nitride, aluminum nitride, sapphire, indium phosphide, gallium arsenide, or germanium. In particular, the receiving substrate may be made of silicon with a low oxygen content. Such a receiving substrate may be provided by using a zone melting growth method.

Beneficially, the method also includes finishing a front face of the remainder of the source substrate after detachment occurs, for use in subsequent bonding operations.

BRIEF DESCRIPTION OF THE DRAWINGS

Other aspects, purposes and advantages of the invention will become clear after reading the following detailed description with reference to the attached drawings, in which:

FIGS. 6–18 are diagrams showing the steps of alternative methods according to the invention;

FIG. 19 is a graph showing the exfoliated zone percentage, or the percentage of the excess zone removed as a function of the $H^+$ ion implantation dose D, at various implantation energies; and FIG. 20 is a graph showing the values of $H^+$ ion implantation energy E as a function of the $H^+$ ion implantation dose D to obtain 100% exfoliation or removal of the thin layer.

DETAILED DESCRIPTION OF THE PREFERRED EMBODIMENTS

Figure 1:
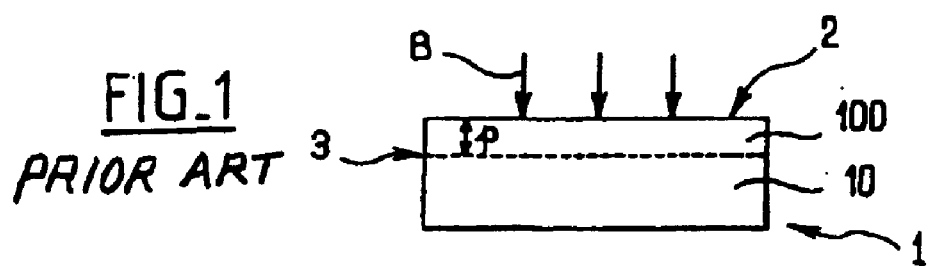
FIGS. 1–5 are diagrams showing the different steps of a method of transfer of a thin silicon carbide layer according to the prior art.
Figure 2:
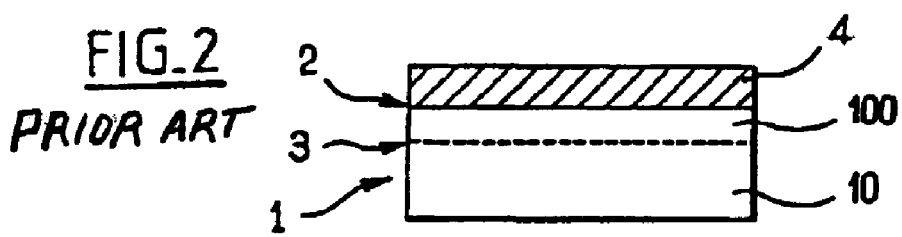
Figure 3:
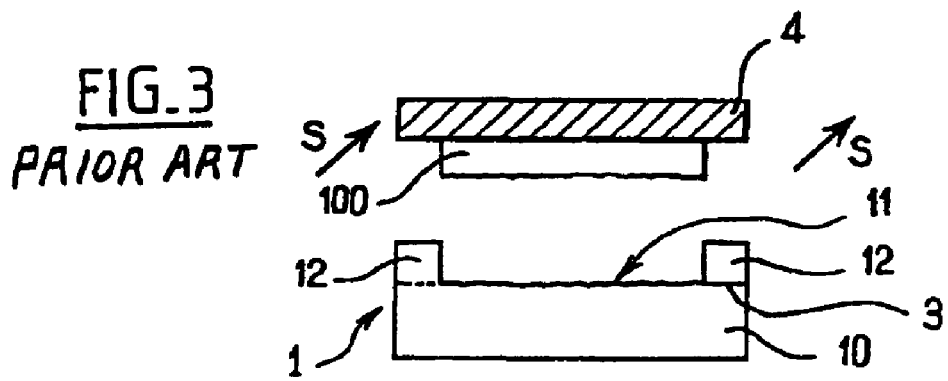
Figure 4:
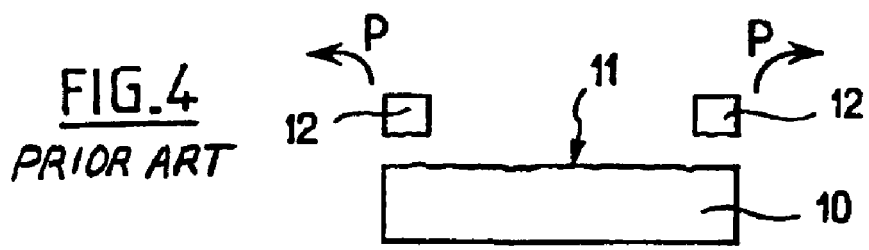
Figure 5:

The methods according to the invention will now be described with reference to FIGS. 6–18. FIGS. 6–18 are similar to FIGS. 1–5, and identical elements have the same reference numerals.

Referring to FIG. 6, a goal of the invention is to optimize the implantation conditions B of atomic species within a source substrate 1 of monocrystalline silicon carbide. In particular, it is desired to create an "optimal weakened zone" 5 in the neighborhood of the mean depth p of ion implantation, so that it is possible to remove or exfoliate, after the useful layer 100 is detached and after an appropriate thermal budget is applied, 100% or substantially about 100% of the blistered excess zone 12 which remained integral to the remainder 10 of the source substrate in the prior art (see FIG. 3). "Optimally weakening" means introducing atomic species into the crystal in a precise and controlled manner in order to optimally activate the weakened mechanisms used. The implantation of atomic species consists of bombarding the front face 2 of the substrate 1 with $H^+$ ions, and possibly jointly bombarding with $H^+$ ions and helium or boron ions, wherein the $H^+$ ions nevertheless remain in the majority. The implantation of these ions through the surface of the monocrystalline silicon carbide source substrate 1 is performed using an ion beam implanter.

Various tests were conducting concerning implanting ions through the surface of a silicon carbide source substrate 1 in order to determine the best operating conditions. As illustrated in FIGS. 7 and 8, which show the crystalline structure of silicon carbide, the implantation B of ions is always performed perpendicularly to the planar surface 2 of the source substrate 1. The case illustrated in FIG. 7 corresponds to an oriented silicon carbide crystal (known to those skilled in the art by the term "on axis"), wherein the stacking of silicon and carbon atoms are situated in a plane parallel to the upper planar surface or front face 2. The ions then penetrate parallel to the crystal growth axis C of the crystal. In contrast, the case illustrated in FIG. 8 corresponds to a disoriented silicon carbide crystal (known to those skilled in the art by the term "off axis"), wherein the stacking of silicon and carbon atoms are situated in a plane which is not parallel to the front face 2, but which forms an angle $\alpha$ with the latter. The ions then penetrate along an axis perpendicular to the front face 2 but angularly offset from the crystal growth axis C by the value of this angle $\alpha$. The disorientation of the crystal is obtained in an artificial fashion, generally by cutting the crystal. The angle $\alpha$ can have different values, but is 3.5°, 8°, or 15° in current commercially available crystals of silicon carbide.

In the two cases shown in FIGS. 7 and 8, microcavities 50 are formed as a result of ion implantation in a plane that is perpendicular to the crystalline growth axis C. Consequently, in the oriented crystal of FIG. 7, the microcavities 50 are parallel to the front face 2 and form an optimal weakened zone 5 that is parallel to the plane of the front face 2. This optimal weakened zone 5 is a substantially continuous fracture line. In contrast, in the disoriented crystal shown in FIG. 8, the microcavities 50 are inclined with respect to the plane of the front face 2 and do not form a continuous line.

It has been observed experimentally that for a given implantation dose D and energy E, a greater weakening of the zone 5 is obtained when implantation is performed on a disoriented crystal. For later processing, such an optimized weakened zone results in an improvement in the exfoliation percentage of the excess zone 12 (shown in FIG. 3). In an advantageous manner, such ion implantation is performed in a random fashion, to avoid the phenomenon termed "channeling". The channeling phenomenon occurs when ions are implanted along specific channels or crystallographic axes. The ions thus introduced encounter fewer atoms on their trajectories, resulting in fewer interactions and less braking of the ions. These ions will therefore be implanted deeper. The process according to the invention seeks to avoid this channeling phenomenon for industrial reasons, because channeled implantation is not an industrially feasible technique.

Furthermore, in order to improve the percentage of exfoliation obtained during detachment, and to operate in a random implantation mode, it is preferable (but not obligatory) to perform ion implantation through a layer of amorphous material 20 that has been formed on the front face 2 of the source substrate 1. This alternative embodiment is shown in FIG. 9. The layer of amorphous material 20 is advantageously a layer of silicon oxide ($SiO_2$) or of silicon nitride ($Si_3N_4$). However, it should not exceed a thickness of about 50 nm ($5 \times 10^{-9}$ m), at the risk of modifying the relationship connecting the implantation energy E and the implanted dose D as will be defined below.

Finally, the tests performed showed that ion implantation should preferably be preformed without external heat supplied, so that it is at a maximum temperature of about 200° C., wherein the implantation is able to bring the silicon carbide substrate substantially to this temperature. If the substrate is heated during implantation, for example to temperatures markedly greater than 650° C., degradation or suppression of the macroscopic exfoliation phenomenon is observed. This can be explained by the activation during implantation of diffusion and recrystallization mechanisms which participate in the process. This activation in situ, which is not controlled, degrades the control of the desired exfoliation or removal effect. Other, complementary tests were conducted to determine the best pairs of implantation dose D and implantation energy E to be used. These trials will be described in detail below.

Referring to FIG. 10, the receiving substrate 4 is next bonded to the front face 2 of the source substrate 1. The substrate 4 is advantageously bonded to the front face 2 by molecular adhesion, since this is the mode of bonding best suited to electronic applications, and because of the homogeneity of the bonding forces used and of the possibility of bonding together numerous materials of different natures. However, bonding could likewise be performed by other known prior art techniques. Bonding can be performed by contacting one of the contact faces 40 of the receiving substrate 4 to the front face 2 of the source substrate 1, either directly (see FIG. 10) or by means of one or more intermediate bonding layers 6 deposited on the contact face 40 of the substrate 4 (as shown in FIG. 11), or onto these two faces. These intermediate bonding layers 6 may be insulating layers, for example, of silicon oxide ($SiO_2$) or silicon nitride ($Si_3N_4$), or may be conductive layers. It should noted that when the implantation B is performed through a layer of amorphous material 20, the latter can then play the part of an intermediate bonding layer 6. As a result, an assembly of layers as illustrated in FIGS. 12 and 13, respectively, is obtained.

The receiving substrate is advantageously (but not obligatory) chosen from silicon, silicon carbide, gallium nitride (GaN), aluminum nitride (AlN), sapphire, indium phosphide (InP), gallium arsenide (GaAs), or germanium (Ge). Other materials can likewise be used. The receiving substrate can likewise be a fragile or weakened substrate, such as silicon obtained by zone fusion growth, with a low oxygen content, such as monocrystalline silicon obtained by the zone fusion method starting from polycrystalline silicon.

Figure 14:
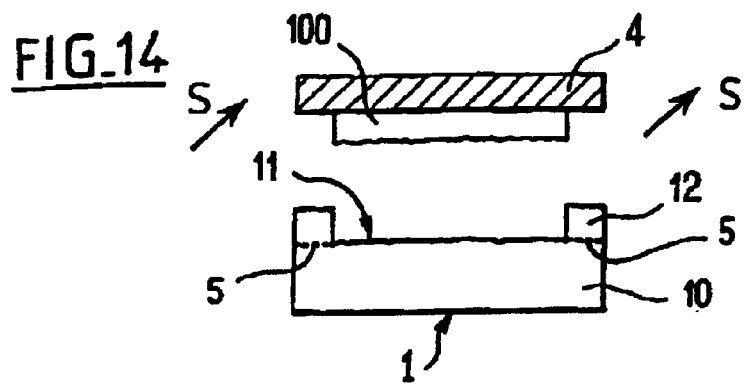
Figure 15:
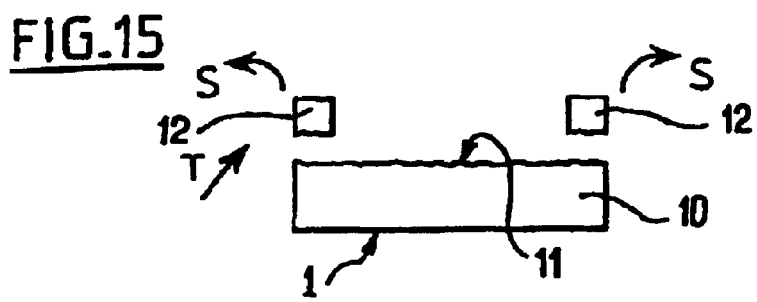

Referring to FIG. 14, the receiving substrate 4 and the thin layer 100 are then detached (arrows "S") from the remainder 10 of the source substrate 1. Detachment S can be performed either by application of external mechanical stresses, or by a thermal treatment with an appropriate thermal budget (see FIG. 17). In a manner known to those skilled in the art, the external mechanical stresses can be, for example, the application of shear, traction, or compression forces, or the application of ultrasound, or of an electrostatic or electromagnetic field. If the detachment S is performed using external mechanical stresses, an annealing treatment then follows according to an appropriate thermal budget to completely, or almost completely, exfoliate or remove the excess zone 12 of the thin layer 100 from the source substrate 1. This excess zone remained integral to the source substrate 1 (see FIG. 14) and did not bond to the receiving substrate 4 so it is removed (see FIG. 15). The thermal budget corresponds to the product of the annealing treatment temperature and the duration of this treatment. Such a treatment is simpler and quicker to use than the polishing used in the prior art. Lastly, a finishing step F of the source substrate 1 may be conducted (see FIG. 16). This finishing step is for eliminating the surface roughness 11. It is generally performed by mechanical-chemical polishing. The free surface of the thin layer 100 can likewise be finished.

Figure 16:
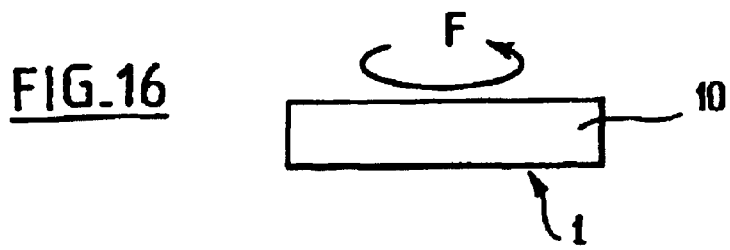
Figure 17:
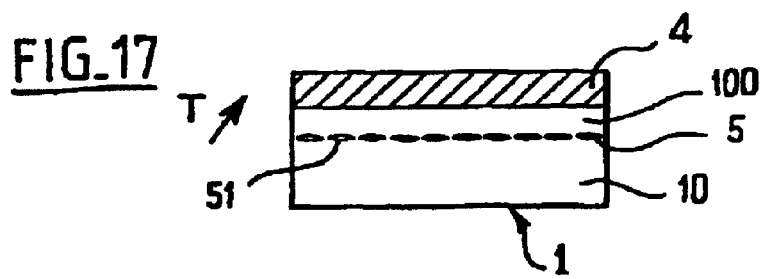
Figure 18:
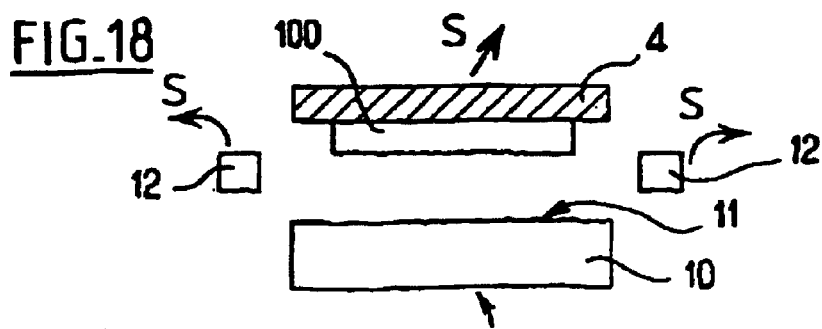

If the detachment S of the thin layer 100 from the remainder 10 of the source substrate 1 is performed by a thermal annealing treatment (see FIG. 17), a complete or substantially complete exfoliation or removal of the excess zone 12 then simultaneously occurs (see FIG. 18). In practice, such an application of heat causes the defects or microcavities 50 to grow until they form micro-cracks 51 which, when connected together, result in a cleavage plane and in detachment along the optimal weakened zone 5. An optional finishing step F is then performed, as illustrated in FIG. 16.

The tests used to determine the best pairs of values of implantation dose D and implantation energy E of $H^+$ ions will now be described. In particular, the tests were conducted under the following operating conditions. $H^+$ ion implantation was performed on the front face of a monocrystalline silicon carbide $SiC_4H$ substrate disoriented by 8° (known to those skilled in the art as "$SIC_4H$ 8° off-axis"), covered with an amorphous layer of silicon oxide about 50 nanometers (50 nm) thick. The implantation temperature was below 200° C. Four series of tests were performed with implantation energies E of respectively 50 keV, 95 keV, 140 keV and 180 keV. For each value of energy E, the implantation dose D was varied between $5.25 \times 10^{16}$ H+$cm^2$ and $8 \times 10^{16}$ H+/$cm^2$. A receiving substrate 4 made of silicon was then applied to the source substrate 1, and annealing was then performed at 900° C. for 1 hour. The percentage of the peripheral zone 12 that was removed or exfoliated, which in the prior art remained integral with the remainder 10 of the substrate, was then measured. The results obtained are given in the following Table wherein a value of 100% means that the entire excess zone 12 which is not in intimate contact (that is, has not adhered) to the receiving substrate 4 is removed. A value of 30%, for example, means that only 30% of the excess zone 12 was removed, and that 70% of the excess zone 12 remained integral with the remainder 10 of the substrate 1.

| | Implantation | Implantation dose D ($10^{16}$ H$^+$/cm$^2$) | | | | | | | | | |
|---|---|---|---|---|---|---|---|---|---|---|---|
| | Energy E (keV) | 5.25 | 5.5 | 5.75 | 6 | 6.5 | 6.75 | 7 | 7.25 | 7.5 | 8 |
| Exfoliated | 50 | | 5 | 50 | 15 | | | | | | |
| Zone | 95 | | | 10 | | 100 | 60 | 30 | | | |
| (%) | 140 | | | | | 40 | 80 | 100 | 60 | 40 | |
| | 180 | | | | | 30 | | 90 | 100 | 80 | 40 |

Tests conducted with implantation energies less than 50 keV did not give good removal results. The results obtained above have also been graphed in FIG. 19. As shown, for each implantation energy B value greater than or equal to 95 keV, there is an implantation dose value D which enables 100% removal of the excess zone to be obtained (bell-shaped curves obtained).

FIG. 20 is a graph showing the H+ ion implantation dose D as a function of the implantation energy E of these same ions to obtain 100% removal or exfoliation of the excess zone. The straight line obtained corresponds to the following equation:

$$D = E \times 1.10^{14} + 5.10^{16} \quad (1)$$

with $E \geq 95$ keV, in which the H+ ion implantation energy E is expressed in keV and the implantation dose D of these ions is expressed in H+ ions/cm$^2$.

Taking into account any fluctuations of the values of D and E connected to possible slight experimental variations and to manufacturing tolerances and control of the implantation apparatus used, it has been discovered that the pair of values (of D and B) should obey the following equation:

$$-\epsilon \times D \leq D - (E \times 1 \times 10^{14} - 5 \times 10^{16}) \leq \epsilon \times D \quad (2)$$

where D and E have the aforementioned meanings and where $\epsilon \times D$ represents the absolute tolerance for a given value of E between the theoretical value of D obtained according to the above Equation (1) and an acceptable value of D, and where e represents the relative tolerance. After experimentation, it was considered that this relative tolerance e was equal to 10%.

The following equation (3) results from this:

$$-0.1 \times D \leq D - (E \times 1 \times 10^{14} + 5 \times 10^{16}) \leq 0.1 \times D \quad (3)$$

which can also be expressed as the following equation (4):

$$[(E \times 1 \times 10^{14} + 5 \times 10^{16})/1.1] \leq D \leq [(E \times 1 \times 10^{14} + 5 \times 10^{16})/(0.9)] \quad (4)$$

The pairs of values of D and E which obey the above equation (4) permit an optimal weakening of the weakened zone 5 to be obtained, and after having applied a sufficient thermal budget, permits complete or almost complete removal of the excess zone 12, which is the portion of the useful layer that has not been transferred to the receiving substrate 4.

Supplementary tests were then performed to determine the appropriate thermal budget. Below 700° C., the mechanisms of diffusion of hydrogen within the SiC material are practically inoperative. It was thus possible to determine that the thermal budget necessary for complete or almost complete removal or exfoliation of the excess zone 12 should be above about 700° C. and preferably above about 800° C. The result obtained therefore, is a thin layer 100 of SiC of good crystalline quality, and a source substrate 1 having a front face 11 which is free from surface topologies or an excess zone 12.

What is claimed is:

1. A method for transferring a useful layer of silicon carbide to a receiving substrate, comprising:

implanting at least H$^+$ ions through a front face of a source substrate of silicon carbide with an implantation energy E greater than or equal to 95 keV and an implantation dose D of H$^+$ ions, expressed as a number of H$^+$ ions/cm$^2$, satisfies the equation:

$$[(E \times 1 \times 10^{14} + 5 \times 10^{16})/1.1] \leq D \leq [(E \times 1 \times 10^{14} + 5 \times 10^{16})/(0.9)]$$

to form an optimal weakened zone near a mean implantation depth, the optimal weakened zone defining the useful layer and a remainder portion of the source substrate;

bonding the front face of the source substrate to a contact face of the receiving substrate; and detaching the useful layer from the remainder portion of the source substrate along the weakened zone while minimizing or avoiding forming an excess zone of silicon carbide material at the periphery of the useful layer that was not transferred to the receiving substrate during detachment, to thus facilitate recycling the remainder portion of the source substrate.

2. The method of claim 1, wherein the implanted ions comprise H$^+$ ions, a combination of H$^{30}$ ions and helium ions or a combination of H$^+$ ions and boron ions.

3. The method of claim 1, which further comprises implanting H$^+$ ions while maintaining the source substrate at a temperature that is no greater than 200° C.

4. The method of claim 1, wherein the source substrate comprises a disoriented monocrystalline silicon carbide.

5. The method of claim 1, which further comprises detaching the useful layer along the optimal weakened zone by applying a thermal budget or mechanical stresses in a manner so that no excess zone remains.

6. The method of claim 5, wherein the useful layer is detached by applying a thermal budget at a temperature that is greater than about 700° C.

7. The method of claim 1, which further comprises implanting ions in a random fashion.

8. The method of claim 1, which further comprises providing a layer of amorphous material on the source substrate before implanting ions, wherein the thickness of the amorphous material is less than or equal to about 50 nanometers.

9. The method of claim 8, wherein the amorphous material is formed of silicon oxide or silicon nitride.

10. The method of claim 1, wherein the bonding step comprises molecularly adhering the receiving substrate to the front face of the source substrate.

11. The method of claim 10, which further comprises providing an intermediate bonding layer on at least one of the front face and the contact face.

12. The method of claim 11, wherein the intermediate bonding layer comprises an amorphous material.

13. The method of claim 12, wherein the amorphous material is silicon oxide or silicon nitride.

14. The method of claim 1, wherein the receiving substrate comprises at least one of silicon, silicon carbide, gallium nitride, aluminum nitride, sapphire, idium phosphide, gallium arsenide, or germanium.

15. The method of claim 1, wherein the receiving substrate comprises silicon having a low oxygen content.

16. The method of claim 1, further comprising providing a finished front face of the remainder of the source substrate after detachment for use in subsequent bonding operations.

17. The method of claim 1 wherein the layer is detached by heating the source substrate/receiving substrate assembly to a temperature of above 700° C. until the layer detaches.

18. The method of claim 1 wherein the layer is detached by heating the source substrate/receiving substrate assembly to a temperature of above 800° C. until the layer detaches.

19. The method of claim 1 wherein the layer is detached while minimizing formation of an excess zone of silicon carbide material at the periphery of the useful layer that was not transferred to the receiving substrate during detachment.

20. The method of claim 1 wherein the layer is detached while completely avoiding formation of an excess zone of silicon carbide material at the periphery of the uselful layer that was not transferred to the receiving substrate during detachment.

* * * * *

UNITED STATES PATENT AND TRADEMARK OFFICE
CERTIFICATE OF CORRECTION

PATENT NO. : 6,974,760 B2
DATED : December 13, 2005
INVENTOR(S) : Ghyselen et al.

It is certified that error appears in the above-identified patent and that said Letters Patent is hereby corrected as shown below:

Title page,
Item [56], References Cited, OTHER PUBLICATIONS,
"Bennett J.A. et al." reference, change "Complete Exfoliation of 4H-SIC by H+- and SI+- Coimplantation" to -- Complete surface exfoliation of 4H-SiC by $H^+$ - and $Si^+$ -coimplantation --.

Column 8,
Line 2, change "$H^{30}$" to -- $H^+$ --.

Column 9,
Line 5, change "idium" to -- indium --.

Signed and Sealed this

Fourteenth Day of February, 2006

JON W. DUDAS
*Director of the United States Patent and Trademark Office*